(12) United States Patent
Metsis et al.

(10) Patent No.: US 8,443,331 B2
(45) Date of Patent: May 14, 2013

(54) SYNCHRONIZING TAP CONTROLLER AFTER POWER IS RESTORED

(75) Inventors: Sophocles R. Metsis, Wakefield, MA (US); Michael Ricchetti, Nashua, NH (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 54 days.

(21) Appl. No.: 12/853,940

(22) Filed: Aug. 10, 2010

(65) Prior Publication Data

US 2012/0042293 A1   Feb. 16, 2012

(51) Int. Cl.
G06F 17/50   (2006.01)

(52) U.S. Cl.
USPC .......................................................... 716/136

(58) Field of Classification Search .................. 716/100, 716/136
See application file for complete search history.

(56) References Cited

U.S. PATENT DOCUMENTS 6,378,090 B1 *   4/2002   Bhattacharya ................. 714/724
2008/0304606 A1 *  12/2008   Swoboda ....................... 375/356
2011/0320850 A1 *  12/2011   Swoboda ....................... 713/400

OTHER PUBLICATIONS

IEEE Std 1149.1-1990, "IEEE Standard Test Access Port and Boundary—Scan Architecture," New York, NY, 1990, 138 pages.

National Semiconductor, "SCANSTA111—Enhanced SCAN Bridge Multidrop Addressable IEEE 1149.1 (JTAG) Port," datasheet, Feb. 25, 2010, pp. 1-32, www.national.com.
"IEEE Standard for Reduced-Pin and Enhanced-Functionality Test Access Port and Boundary-Scan Architecture," IEEE Std 1149.7-2009, UTC from IEEE Xplore, downloaded Apr. 15, 2010, Part 1, 340 pages.
"IEEE Standard for Reduced-Pin and Enhanced-Functionality Test Access Port and Boundary-Scan Architecture," IEEE Std 1149.7-2009, UTC from IEEE Xplore, downloaded Apr. 15, 2010, Part 2, 330 pages.
"IEEE Standard for Reduced-Pin and Enhanced-Functionality Test Access Port and Boundary-Scan Architecture," IEEE Std 1149.7-2009, UTC from IEEE Xplore, downloaded Apr. 15, 2010, Part 3, 200 pages.
"IEEE Standard for Reduced-Pin and Enhanced-Functionality Test Access Port and Boundary-Scan Architecture," IEEE Std 1149.7-2009, UTC from IEEE Xplore, downloaded Apr. 15, 2010, Part 4, 115 pages.

* cited by examiner

*Primary Examiner* — Suchin Parihar
(74) *Attorney, Agent, or Firm* — Abel Law Group, LLP (57) ABSTRACT

A system includes multiple TAP controllers that can be independently powered up and down. When a first TAP controller is powered up from a powered-down state while a second TAP controller is already in a powered-up state, the first TAP controller is reset causing the first TAP controller to enter a reset state in response to the power-up of a module on which the first TAP controller is disposed. The first TAP controller enters an idle state and its control signal is gated to hold the first TAP controller in the idle state until the second TAP controller enters the idle state. Subsequently, the first TAP controller is released such that the control signal supplied to the first and second TAP controllers are equal, thereby synchronizing the first TAP controller and the second TAP controller.

20 Claims, 6 Drawing Sheets

FIG. 7

SYNCHRONIZING TAP CONTROLLER AFTER POWER IS RESTORED

BACKGROUND

1. Field of the Invention

This invention relates to test logic in electronics and more particularly to synchronizing test logic.

2. Description of the Related Art

Figure 1:
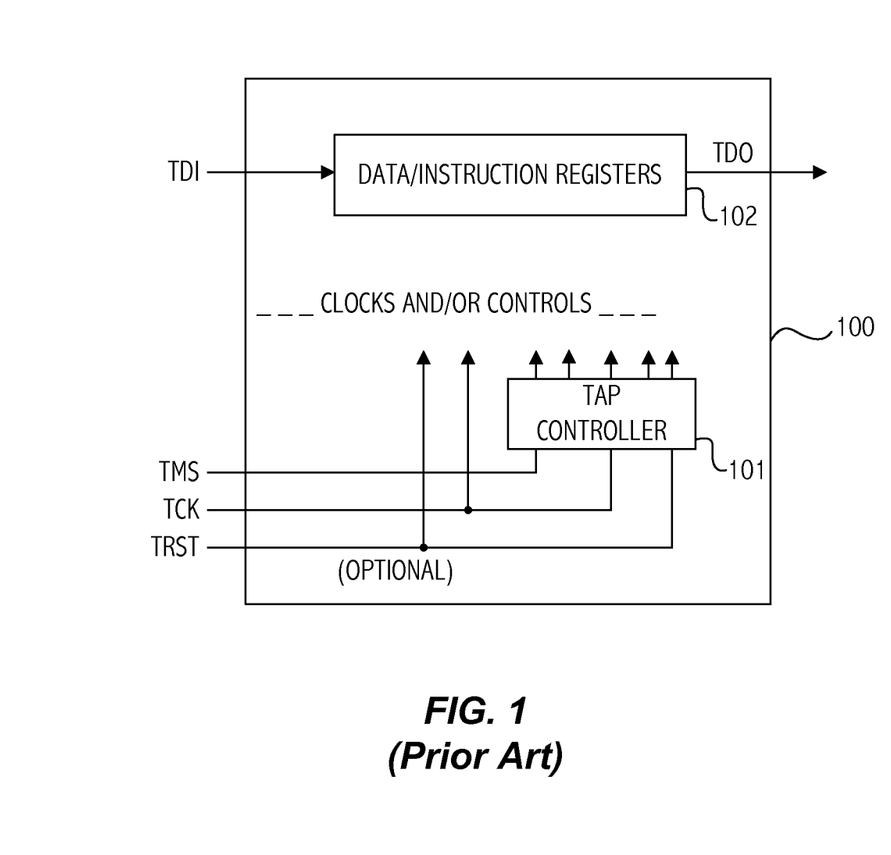
FIG. 1 illustrates a prior art test architecture.
Figure 2:
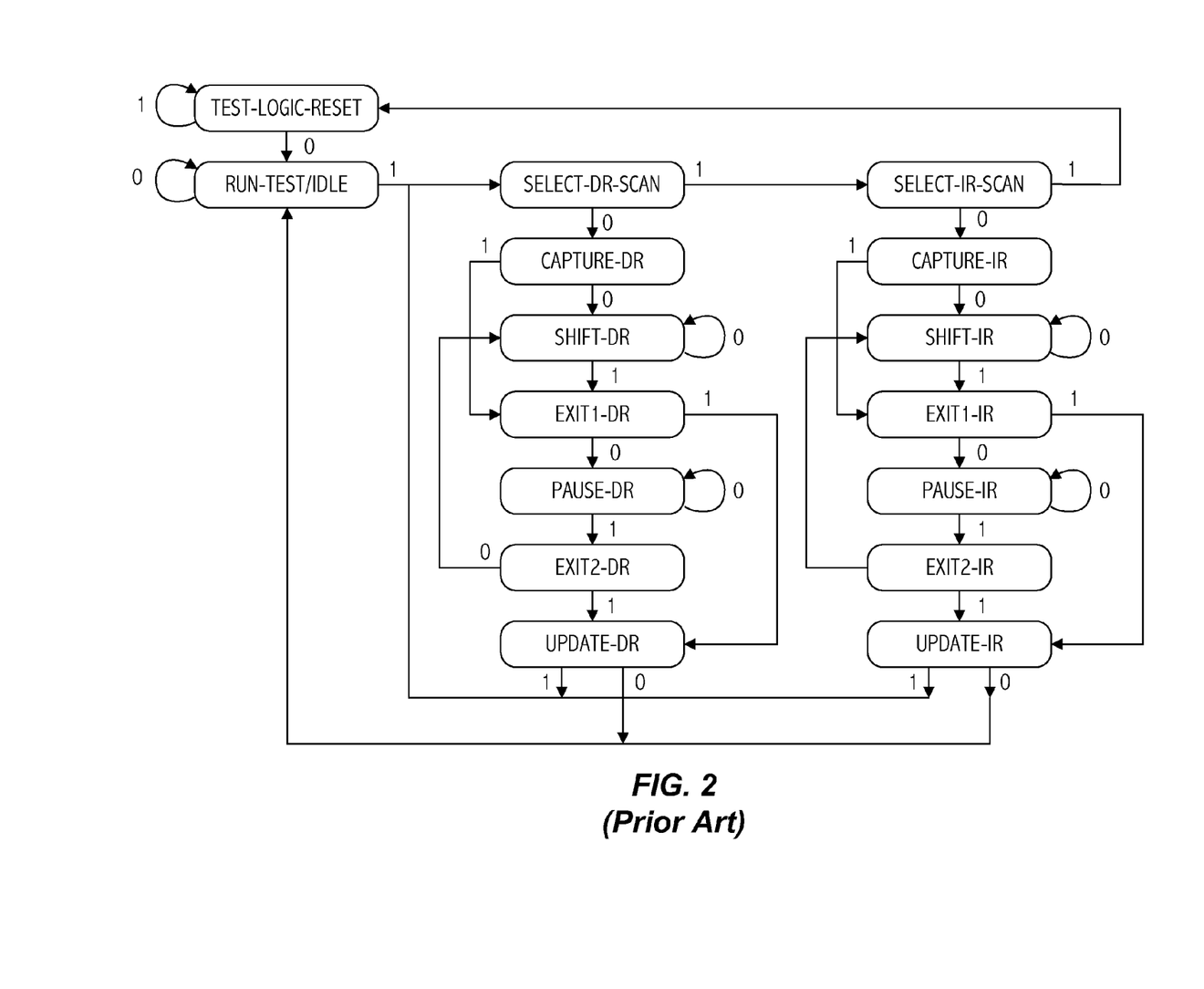
FIG. 2 illustrates a state machine associated with the test architecture of FIG. 1.

IEEE 1149.1 Standard Test Access Port and Boundary-Scan Architecture, also known as Joint Test Action Group (JTAG), provides a way to debug and test integrated circuits and boards. JTAG defines a test access port (TAP), which provides the capability to perform debug and testing. An exemplary JTAG test architecture 100 is shown in FIG. 1 and includes a TAP controller 101, and data and instruction registers 102 supplied by test data in (TDI) and supplying test data out (TDO). The TAP controller 101 receives a test clock (TCK), a control signal (test mode select (TMS)), and an optional reset signal TRST. The state machine associated with the TAP controller is shown in FIG. 2.

SUMMARY

Accordingly, one embodiment provides a way to resynchronize multiple TAPs so that when a TAP that is powered up is powered down, and then is powered up again, it can be resynchronized to other TAPs already in the powered-up state.

In one embodiment, a method is provided for synchronizing test access port (TAP) controllers that includes causing a first TAP controller to enter a first predetermined state in response to powering up the first TAP controller while a second TAP controller is in a powered-up state. The first TAP controller is held in a first predetermined state. Responsive to an indication from the second TAP controller that the second TAP controller is in a second predetermined state, releasing the first TAP controller from being held in the first predetermined state, thereby synchronizing the first TAP controller with the second TAP controller. The first and second predetermined states may be an idle state.

In another embodiment, an apparatus is provided that includes a resynchronization circuit coupled to receive a power indication of a module power state of a first module and a test control signal, and to supply a module test control signal. A first test access port (TAP) controller is associated with the first module and is coupled to receive the module test control signal. A second test access port (TAP) controller is maintained in a power-up state while the first TAP controller is powered down and is coupled to receive the test control signal and to supply to the resynchronization circuit a state indication. The resynchronization circuit includes logic responsive to the power indication indicating that the first TAP controller has powered up, to provide one or more control signals including the module test control signal to cause the first TAP controller to enter a first state and to stay in the first state until after the second TAP controller enters a second state, and to thereafter, responsive to receipt of the state indication that the second TAP controller has entered the second state, release the module control signal to track the control signal, thereby synchronizing the first TAP controller with the second TAP controller. In an embodiment, the control signal is a test mode select (TMS) signal and the module control signal is a module test mode select (TMS) signal.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 3:
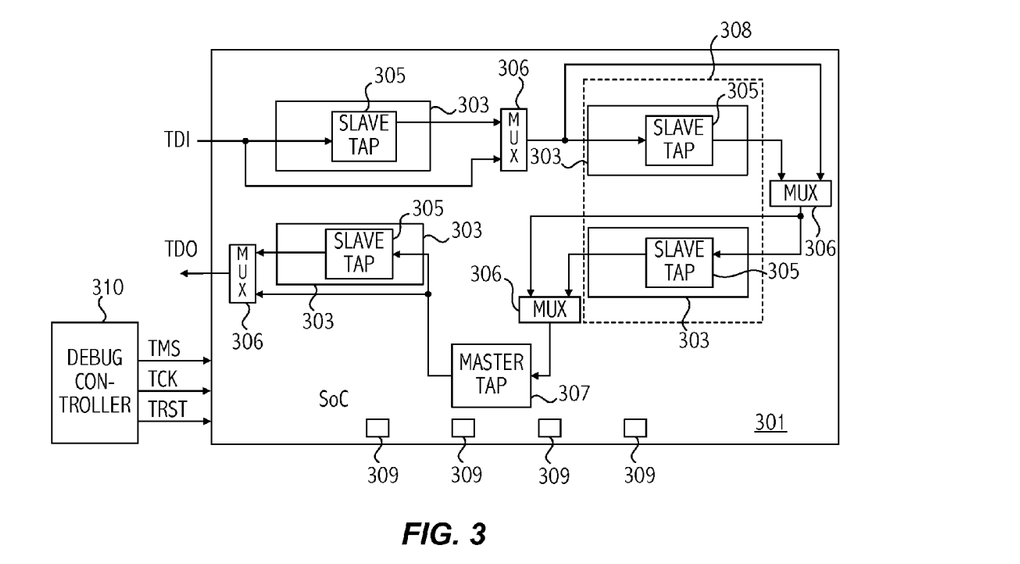
FIG. 3 illustrates a high-level block diagram of an embodiment of the invention.

In modern System-on-Chip (SOC) designs with, e.g., multiple cores, and multiple functions such as memory control and graphics, multiple TAP controllers can exist on a single die or on a multi-chip module (MCM). In order to provide greater control over power consumption, several of these modules can get independently powered down and then back up during normal system operation. Referring to FIG. 3, illustrated is an exemplary embodiment with an integrated circuit 301 that has separate functional modules 303. A test access port (TAP) 305 is associated with each of the modules. The TAPs shown in FIG. 3 are serially connected. The modules may be, e.g., separate cores of a multi-core processor, or another functional unit on the integrated circuit. The four modules 303 shown in FIG. 3 can be independently powered down during normal system operation. If a TAP associated with one of these modules is powered down when the module is powered down, that TAP will lose synchronization with the rest of the TAPs on modules that remain powered.

One solution to avoid losing synchronization would be to disable power-down states when using JTAG. That, however, could inhibit certain types of test and debug capabilities. Another solution to avoid losing synchronization would be to avoid having multiple TAPs in the design, also a less than desirable solution. Another solution would be to reset all the TAPs in the system whenever a TAP has been powered down, but that could result in undesirable loss of information in the TAPs that are reset even though they were not powered down.

Instead, according to an embodiment of the invention, when a powered down TAP (or TAPs) has its power restored, the TAP is resynchronized with the active TAPs. In an embodiment, a single TAP controller retains power at all times while the system is powered. For the purposes of this description, the TAP that always has power will be referred to as the master TAP 307 and the other TAPs 305, as the slave TAPs. The Master TAP 307 may be associated with its own module or other logic supporting multiple ones of the modules. The resynchronization goal is to get the slave TAPs that get their power restored synchronized with the master TAP, and as early as possible. As explained more fully below, resynchronization logic 309 is provided for each of the modules that can be powered down. The integrated circuit 301 receives the standard JTAG signals TCK, TMS, and TRST from a debug controller 310, which signals are supplied to the Master TAP. The slave TMS and slave TRST signals supplied to the slave TAPs are modified from the original TMS and TRST signals by their associated resynchronization logic 309 to assure that the slave TAPs resynchronize to the master TAP when they are powered on. In an embodiment, multiplexers 306 provide the ability to bypass any powered down module 303 and maintain the serial chain from input to output intact to allow for debugging or other JTAG activity to the active modules. In an embodiment, multiple ones of the modules 303 may be on the same power plane 308. In such an embodiment, a single resynchronization logic block 309 may be provided to the multiple modules because resynchronization of the multiple modules on the same power plane from a powered down state occurs simultaneously.

Figure 4:
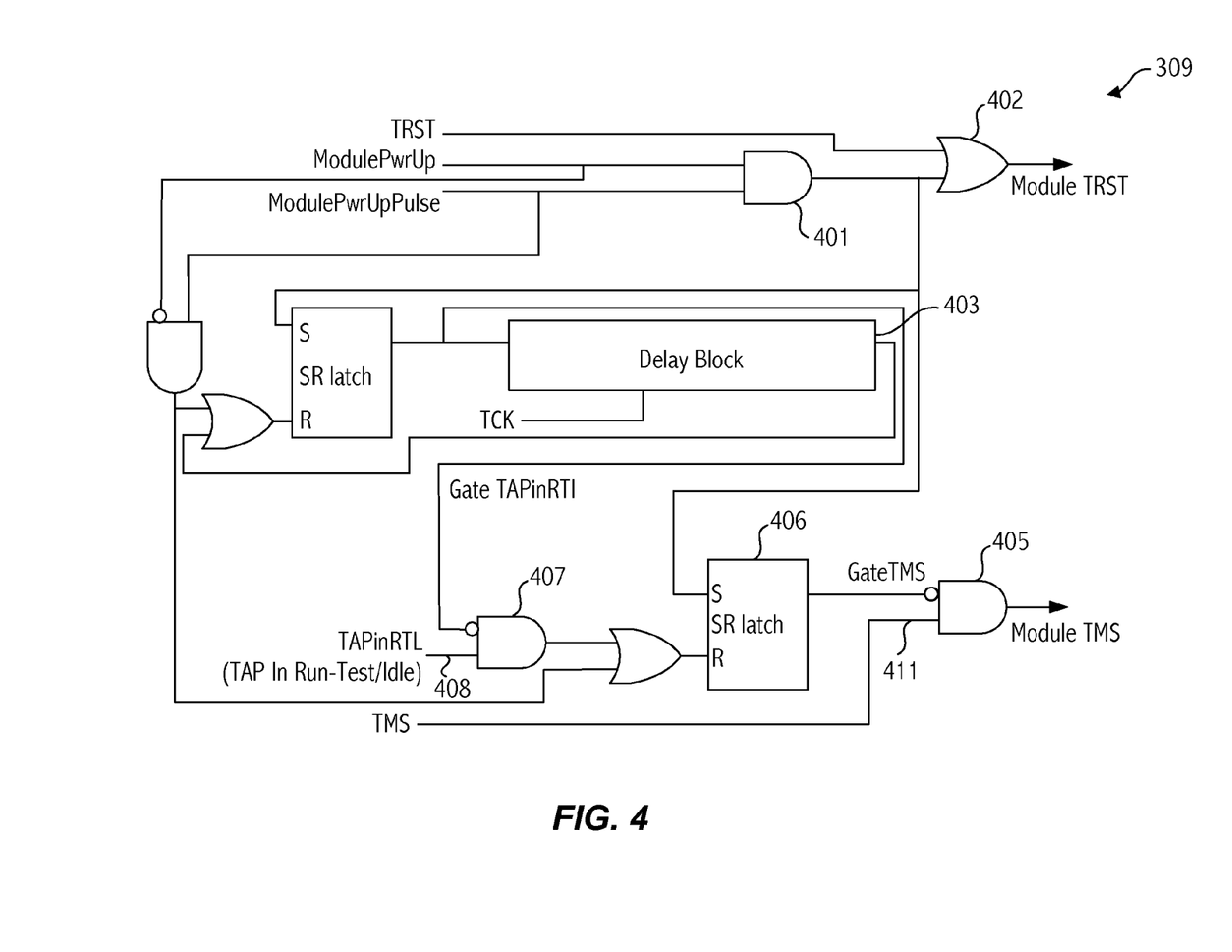
FIG. 4 illustrates a synchronizer circuit according to an embodiment of the invention.
Figure 5:
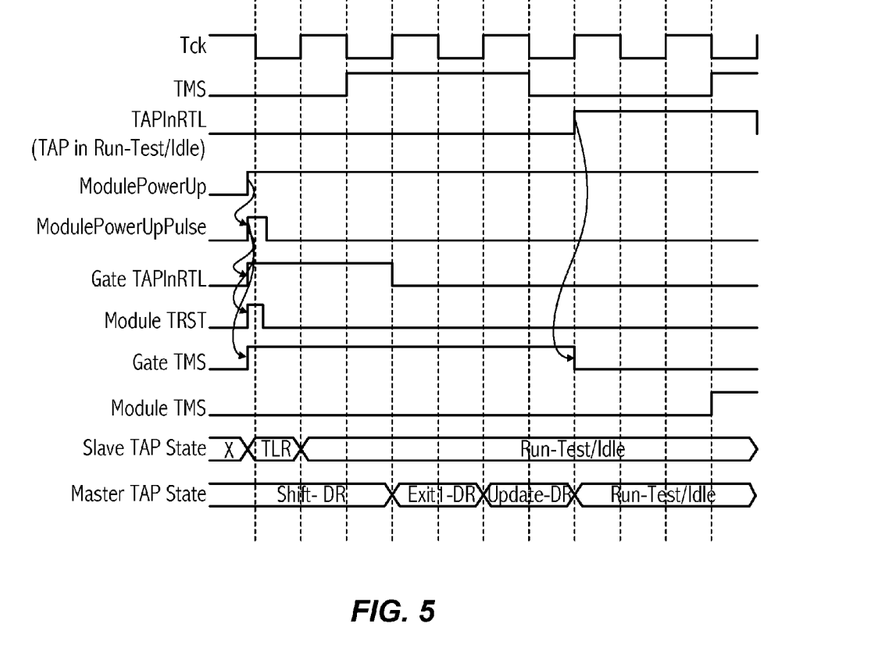
FIG. 5 illustrates a timing diagram associated with a synchronizer circuit according to an embodiment of the invention.

FIGS. 4 and 5 describe the resynchronization mechanism according to an exemplary embodiment of the invention. FIG. 4 shows a block diagram of an exemplary resynchronizing circuit 309. FIG. 5 shows a timing diagram associated with the exemplary resynchronizing circuit 309. Referring to FIGS. 4 and 5, ModulePowerUp is a signal that indicates whether power is on for a particular module 303 that is associated with the particular resynchronizing circuit. When the ModulePowerUp signal asserts, a pulse, ModulePowerUpPulse, is generated. Referring to FIG. 4, AND gate 401 combines the ModulePowerUp signal and the ModulePowerUpPulse to generate a module test reset signal for the slave TAP. The module may be powered up asynchronously to TCK. Module TRST is asynchronous to TCK as specified in IEEE 1149.1. The assertion of the module TRST input forces the slave TAP into the Test-Logic-Reset state (TLR) (see FIG. 2). In the absence of TRST, TMS may be held high for five TCK cycles to force the slave TAP to reset. Once in TLR, and the high time of the pulse has elapsed, the slave TAP will remain in TLR until the following edge of TCK at which point, because the module's TMS is held low by the resynchronization logic, the slave TAP state machine proceeds to the Run-Test-Idle (RTI) state. The idle state is a benign state that in which no JTAG registers, e.g., data/instruction registers 102 (FIG. 1) are changed. At this point, the slave TAP remains in RTI until the master TAP enters RTI. Once the master TAP enters RTI, the slave TAP is synchronized with the master TAP and gating of the control signals by the resynchronization logic ceases.

There is a possibility that the master TAP may enter RTI while the module power-up pulse is high. If that occurs, it is desirable to postpone the resynchronization as the slave TAP is in TLR while the master TAP is in the RTI state. To guarantee that the Module TMS signal is not released early, the width of the reset pulse should be limited to less than one TCK cycle and at least two TCK rising edges need to have elapsed after the power-up pulse first asserted before the Module TMS signal is released to reflect the value of the TMS signal. To achieve this delay, a signal, GateTAPInRTI, is generated by delay block 403. The GateTAPInRTI signal keeps Module TMS low until synchronization is guaranteed to happen. The absence of this gating logic can lead the slave TAP to be out of sync with the master TAP when its TMS is released. Four latches in series clocked on opposite phases of the test clock (TCK) can be used to constitute the delay block 403 to prevent the slave TMS from being released too early. The S-R latches used allow for asynchronous initiation of the resynchronization process and can keep the slave TAP in a benign state regardless of whether TCK is active. The status of the master TAP in the RTI state is provided to AND gate 407 on node 408. After the initial gating of the Module TMS signal with the GateTMS signal provided by SR latch 406, the Module TMS signal is released when the TAPinRTI signal on node 408 is allowed to reset the SR latch 406 after the delay provided by delay block 403 has expired. Once the Module TMS signal is released, it tracks the TMS signal provided on node 411, which is also used by the Master TAP.

Note that gating of the ModulePowerUpPulse can be used to postpone or cancel resynchronization during debug of the module.

Figure 6:
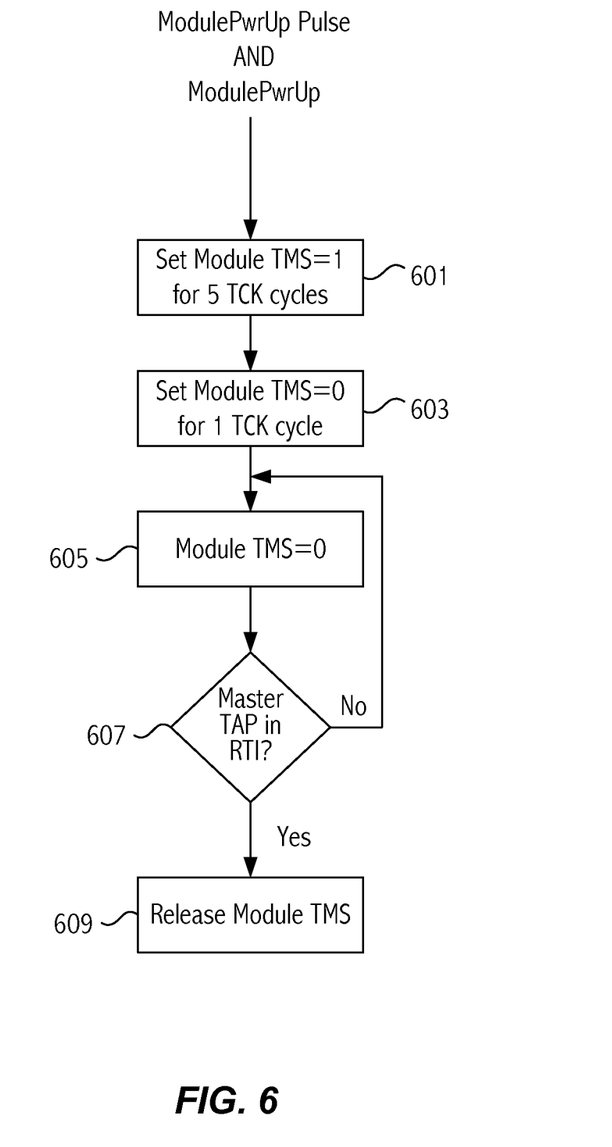
FIG. 6 illustrates a flow diagram of another embodiment of a synchronizer circuit.

In the exemplary embodiment shown in FIG. 4, it is assumed that each slave TAP has a TRST input. Another possibility is that the resynchronization mechanism may need to be used with third party designs that cannot be modified and do not have a TRST input. Embodiments can still be implemented such that no modifications to the module containing the slave TAP are required. In the event that TRST is absent, the TMS signal can be used to reset the slave TAP before synchronization is established. That is achieved by having the resynchronization logic hold TMS high for five TCK cycles prior to forcing it low. Thus, as shown in the simplified flow diagram in FIG. 6, assertion of both the ModulePowerUp signal and the ModulePowerUpPulse cause module TMS to be asserted for five (or more) TCK cycles in 601. Then the module TMS signal is deasserted for one clock cycle in 603 to bring the slave TAP into the RTI state where TMS is held deasserted in 605 until the master TAP is in the RTI mode in 607 at which time the module TMS signal is released in 609. Note that the absence of TRST delays the resynchronization process.

Figure 7:
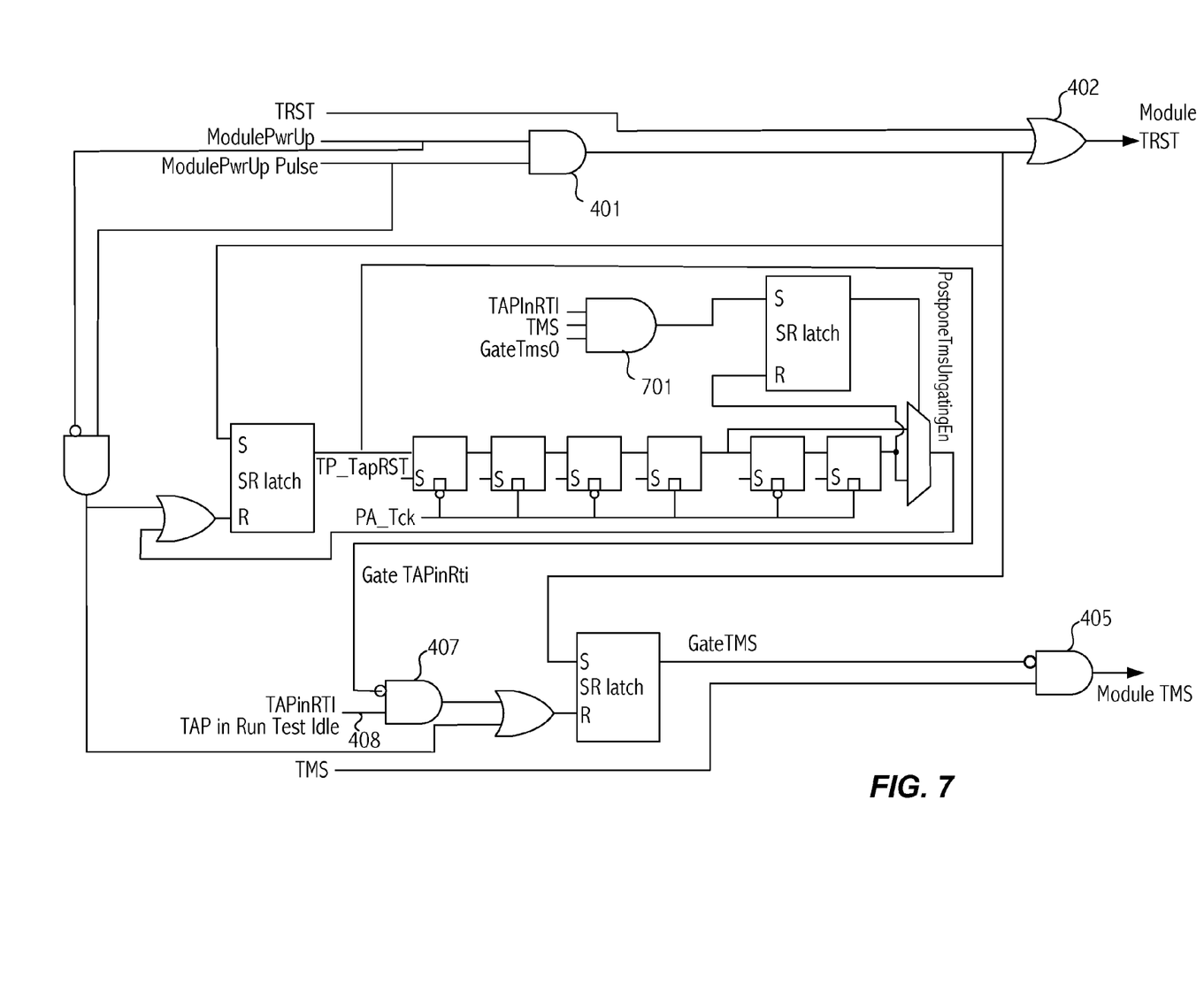
FIG. 7 illustrates another embodiment of a synchronizer circuit.

FIG. 7 illustrates an embodiment of a resynchronization circuit in which an extra delay is added to gate off the TAPinRTI signal under particular conditions that can result in resynchronization problems for particular designs. The particular conditions are those supplied to AND gate 701.

Note that while waiting for the master TAP to enter RTI is one way to accomplish resynchronization, other states may be used. For example, referring to FIG. 2, the master TAP may be in UPDATE-DR while the slave TAP is in RTI. At that point, module TMS can be released, assuming that on the next TCK cycle, with TMS=0, both master and slave TAP will both be in the RTI state.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and computer-readable medium having encodings thereon (e.g., HDL, Verilog, GDSII data) of such circuits, systems, and methods, as described herein. Computer-readable medium includes tangible computer readable medium e.g., a disk, tape, or other magnetic, optical, or electronic storage medium. In addition to computer-readable medium having encodings thereon of circuits, systems, and methods, the computer readable media may store instructions as well as data that can be used to implement the invention. Structures described herein may be implemented using software executing on a processor, firmware executing on hardware, or by a combination of software, firmware, and hardware.

The description of the invention set forth herein is illustrative, and is not intended to limit the scope of the invention as set forth in the following claims. Other variations and modifications of the embodiments disclosed herein may be made based on the description set forth herein, without departing from the scope and spirit of the invention as set forth in the following claims.

What is claimed is:

1. A method for synchronizing test access port (TAP) controllers comprising:
responsive to powering up a first TAP controller while a second TAP controller is in a powered-up state, the first TAP controller entering a reset state and then the first TAP controller entering a first predetermined state, the first predetermined state being an idle state;
holding the first TAP controller in the first predetermined state until, responsive to an indication from the second TAP controller that the second TAP controller is in the second predetermined state, releasing the first TAP controller from being held in the first predetermined state, thereby synchronizing the first TAP controller with the second TAP controller; and
providing a module test reset signal to the first TAP controller in response to assertion of a module power-up indication, thereby causing the first TAP controller to enter the reset state, the module power-up indication indicative of the module with which the first TAP controller is associated having entered a powered-up condition.

2. The method as recited in claim 1 wherein the idle state is a state that ensures internal joint test action group (JTAG) registers do not change.

3. The method as recited in claim 1 further comprising providing a deasserted module test mode select (TMS) signal to hold the first TAP controller in the idle state until, responsive to the second TAP controller entering the idle state, releasing the module TMS signal to track a TMS signal, to release the first TAP controller.

4. The method as recited in claim 3 further comprising:
receiving the test mode select (TMS) signal and logically combining the TMS signal with one or more other signals to generate the module TMS signal.

5. The method as recited in claim 4 further comprising not releasing the module TMS signal for at least two test clock (TCK) rising edges after a pulse on the module test reset signal.

6. The method as recited in claim 1 further comprising:
asserting a module test mode select (TMS) signal supplied to the first TAP controller for at least five test clock periods to cause the first TAP controller to enter the reset state.

7. The method as recited in claim 6 further comprising:
after entering the reset state, causing the first TAP controller to enter the idle state responsive to a deasserted module TMS signal; and
then maintaining the module TMS signal to the first TAP controller deasserted to keep the first TAP controller in the idle state until the second TAP controller is determined to be in the idle state, and then releasing the module TMS signal to allow the module TMS signal to track a TMS signal.

8. An apparatus comprising:
a resynchronization circuit coupled to receive a power indication of a module power state of a first module and a control signal, and to supply a module test control signal;
a first test access port (TAP) controller associated with the first module and coupled to receive the module test control signal;
a second test access port (TAP) controller to be maintained in a power-up state while the first TAP controller is powered down and coupled to receive the test control signal and to supply to the resynchronization circuit a state indication;
wherein the resynchronization circuit includes logic responsive to the power indication indicating that the first TAP controller has powered up, to provide one or more control signals including the module test control signal, to cause the first TAP controller to enter a first state and to stay in the first state until after the second TAP controller enters a second state, and to thereafter, responsive to receipt of the state indication that the second TAP controller has entered the second state, release the module test control signal to track the test control signal, thereby synchronizing the first TAP controller with the second TAP controller.

9. The apparatus as recited in claim 8 wherein the test control signal is a test mode select (TMS) signal and the module test control signal is a module test mode select (TMS) signal.

10. The apparatus as recited in claim 9 wherein the resynchronization circuit is further configured to supply a module test reset (TRST) signal to the first TAP controller responsive to the power indication indicating that the first TAP has entered a powered-up state.

11. The apparatus as recited in claim 10 wherein the power indication includes a module power-up signal pulse.

12. The apparatus as recited in claim 9 wherein the first and second TAP controllers are on a multi-core processor integrated circuit, the first TAP controller associated with a first one of the cores, and wherein power to the first core is independently controlled such that power to the first core may be off when power to another core is supplied.

13. The apparatus as recited in claim 11 wherein the resynchronization circuit further comprises a delay circuit to ensure that at least two test clock (TCK) rising edges have elapsed after the module power-up signal pulse is asserted before the module test mode select (TMS) signal is released to track the test mode select (TMS) signal.

14. The apparatus as recited in claim 11 wherein the resynchronization circuit is further coupled to receive a test reset signal, which is also provided to the second TAP controller, and to logically combine the test reset signal and the power indication to generate the module test reset signal.

15. The apparatus as recited in claim 14 further comprising a test controller to provide the test reset signal and the test mode select signal.

16. The apparatus as recited in claim 10 further comprising:
a third TAP controller coupled to receive from the resynchronization circuit the module TMS signal, and
wherein the first and third TAP controllers are on the same power plane.

17. The apparatus as recited in claim 11 wherein the resynchronization circuit includes logic to assert the module test mode select (TMS) signal supplied to the second TAP controller for a predetermined time period responsive to the power indication indicating that the first TAP controller has powered up, to cause the first TAP controller to enter a reset state.

18. The apparatus as recited in claim 9 wherein the first state and the second state are an idle state.

19. A tangible non-transitory computer-readable medium storing a computer readable representation of an integrated circuit, the computer readable representation comprising:

a resynchronization circuit coupled to receive a power indication of a module power state of a first module and a test mode select (TMS) signal, and to supply a module test mode select (TMS) signal;

a first test access port (TAP) controller associated with the first module and coupled to receive the module test mode select signal;

a second test access port (TAP) controller maintained in a power-up state while the first TAP controller is powered down and coupled to receive the test mode select signal and to supply to the resynchronization circuit a state indication;

wherein the resynchronization circuit includes logic responsive to the power indication indicating that the first TAP controller has powered up, to provide the module test mode select signal at one or more values to cause the first TAP controller to enter a first state and to stay in the first state until after the second TAP controller enters a second state, and to thereafter, responsive to receipt of the state indication that the second TAP controller has entered the second state, release the module TMS signal to track the test mode select (TMS) signal, thereby synchronizing the first TAP controller with the second TAP controller.

20. The tangible non-transitory computer-readable medium as recited in claim 19 wherein the computer readable representation further includes the resynchronization circuit being further configured to supply a module test reset (TRST) signal to the first TAP controller responsive to the indication of the module power state indicating that the first TAP has entered a powered-up state.

* * * * *